(12) United States Patent
Zhang et al.

(10) Patent No.: US 11,189,741 B2
(45) Date of Patent: Nov. 30, 2021

(54) PHOTODIODE DEVICE, PHOTODIODE DETECTOR AND METHODS OF FABRICATING THE SAME

(71) Applicant: NUCTECH COMPANY LIMITED, Beijing (CN)

(72) Inventors: Lan Zhang, Beijing (CN); Haifan Hu, Beijing (CN); Xuepeng Cao, Beijing (CN); Jun Li, Beijing (CN)

(73) Assignee: Nuctech Company Limited, Beijing (CN)

( * ) Notice: Subject to any disclaimer, the term of this patent is extended or adjusted under 35 U.S.C. 154(b) by 0 days.

(21) Appl. No.: 16/343,983

(22) PCT Filed: Sep. 12, 2017

(86) PCT No.: PCT/CN2017/101365
§ 371 (c)(1),
(2) Date: Apr. 22, 2019

(87) PCT Pub. No.: WO2018/103399
PCT Pub. Date: Jun. 14, 2018

(65) Prior Publication Data
US 2019/0334045 A1    Oct. 31, 2019

(30) Foreign Application Priority Data
Dec. 7, 2016 (CN) .......................... 201611121395.6

(51) Int. Cl.
*H01L 31/0352* (2006.01)
*H01L 27/146* (2006.01)
(Continued)

(52) U.S. Cl.
CPC ................. *H01L 31/035272* (2013.01); *H01L 27/14643* (2013.01); *H01L 27/14659* (2013.01);
(Continued)

(58) Field of Classification Search
CPC ...................... H01L 31/035272; H01L 31/028
See application file for complete search history.

(56) References Cited

U.S. PATENT DOCUMENTS

| | | | |
|---|---|---|---|
| 2004/0113185 A1* | 6/2004 | Shibayama | H01L 31/10 257/292 |
| 2005/0156213 A1 | 7/2005 | Han et al. | |
| 2013/0241021 A1* | 9/2013 | Stenson | H01L 27/14643 257/435 |

FOREIGN PATENT DOCUMENTS

| | | |
|---|---|---|
| CM | 104465676 A | 3/2015 |
| CN | 1901239 A | 1/2007 |

(Continued)

OTHER PUBLICATIONS

Extended European Search Report for corresponding European Patent Application No. 17878118.3 dated Apr. 7, 2020, 6 pages.

(Continued)

*Primary Examiner* — Farun Lu
(74) *Attorney, Agent, or Firm* — Merchant & Gould P.C.

(57) ABSTRACT

According to an embodiment, a method of fabricating a photodiode device may include: growing an epitaxial layer on a first surface of a substrate, wherein the epitaxial layer is first type lightly doped; forming, in the substrate, a first type heavily doped region in contact with the first type lightly doped epitaxial layer; thinning the substrate from a second surface of the substrate opposite to the first surface to expose the first type heavily doped region; patterning the first type heavily doped region from the second surface side of the substrate to form a trench therein, that penetrates through the first type heavily doped region and extends into the epitaxial layer, to serve as a first electrode region of the photodiode device; and forming a second type heavily doped (Continued)

region at bottom of the trench, to serve as a second electrode region of the photodiode device.

11 Claims, 14 Drawing Sheets

(51) Int. Cl.
    *H01L 31/02*         (2006.01)
    *H01L 31/18*         (2006.01)
    *H01L 31/028*       (2006.01)
    *H01L 31/0224*     (2006.01)

(52) U.S. Cl.
    CPC ...... *H01L 31/02005* (2013.01); *H01L 31/028* (2013.01); *H01L 31/022408* (2013.01); *H01L 31/18* (2013.01); *H01L 31/1804* (2013.01); H01L 2924/12043 (2013.01)

(56) References Cited

FOREIGN PATENT DOCUMENTS

| | | |
|---|---|---|
| CN | 105448945 A | 3/2016 |
| CN | 106784071 A | 5/2017 |
| CN | 206516638 U | 9/2017 |

OTHER PUBLICATIONS

International Search Report and Written Opinion of the International Searching Authority for International Patent Application No. PCT/CN2017/101365 dated Dec. 22, 2017, 10 pages.

* cited by examiner

PHOTODIODE DEVICE, PHOTODIODE DETECTOR AND METHODS OF FABRICATING THE SAME

This application is a National Stage Application of PCT/CN2017/101365, filed on Sep. 12, 2017, which claims benefit of Chinese Patent Application No. 201611121395.6, filed on Dec. 7, 2016 and which applications are incorporated herein by reference. To the extent appropriate, a claim of priority is made to each of the above disclosed applications.

TECHNICAL FIELD

The present disclosure relates to a photodetector device, and more particularly, to a photodiode device and a photodiode detector having improved performance and methods of fabricating the same.

BACKGROUND

A semiconductor photodiode array may be used to detect incident light (e.g., directly incident light rays, or visible light rays generated by X-rays in a scintillator) by the incident light ionizing atoms in a semiconductor and thereby generating unbalanced carriers. Parameters that measure the performance of the photodiode array may include resolution, signal-to-noise ratio, readout speed, photoresponse, and charge crosstalk between pixels, etc.

For example, short-wavelength visible light generated from the X-rays passing through the scintillator may produce carriers of electrons and holes within a shallow depth on one side of a silicon-based photo device. Those photo-generated carriers drift or diffuse in the device and are collected by an electrode on the other side, thereby producing an electrical signal(s). In consideration of defects in wafers and thus in order to prevent most of the photo-generated carriers from being collected by the defects, thinner wafers, typically having a thickness of 100 to 150 microns, are generally used in the fabrication of back-lit photodiode array detectors. However, an excessively thin wafer may have a reduced overall mechanical strength and is prone to warpage and chipping etc. Re-grinding of wafers before shipment (to make them thinner) is also prone to introduce particle contamination, thereby reducing the quantum efficiency of incident light collection.

Therefore, there is a need to provide new structures to improve, at least in part, the performance of photodiode devices or photodiode arrays.

SUMMARY

In view of this, the present disclosure aims to provide, among others, a photodiode device and a photodiode detector having improved performance and methods of fabricating the same.

According to an aspect of the present disclosure, there is proposed a method of fabricating a photodiode device, including: growing an epitaxial layer on a first surface of a substrate, wherein the epitaxial layer is first type lightly doped; forming, in the substrate, a first type heavily doped region in contact with the first type lightly doped epitaxial layer; thinning the substrate from a second surface of the substrate opposite to the first surface to expose the first type heavily doped region; patterning the first type heavily doped region from the second surface side of the substrate to form a trench therein, that penetrates through the first type heavily doped region and extends into the epitaxial layer, wherein the patterned first type heavily doped region serves as a first electrode region of the photodiode device; and forming a second type heavily doped region at bottom of the trench, wherein the second type heavily doped region serves as a second electrode region of the photodiode device.

According to another aspect of the present disclosure, there is proposed a photodiode device, comprising: a substrate being first type heavily doped and comprising a first surface and a second surface opposite to each other, the first type heavily doped substrate serving as a first electrode region of the photodiode device; an epitaxial layer grown on the first surface of the substrate, wherein the epitaxial layer is first type lightly doped, and is exposed by a trench in the substrate; and a second electrode region formed within the trench and being second type heavily doped, wherein the second electrode region is electrically isolated from the first electrode region.

According to a further aspect of the present disclosure, there is proposed a photodiode detector comprising an array of a plurality of photodiode devices according to any of the above aspects.

According to embodiments of the present disclosure, the device may have a relatively thick overall thickness to maintain a certain mechanical strength. On the other hand, the second electrode region may be relatively recessed, so as to improve the charge collection efficiency.

BRIEF DESCRIPTION OF THE DRAWINGS

The above and other objects, features and advantages of the present disclosure will become more apparent from the following description of embodiments of the present disclosure made with reference to the accompanying drawings, in which.

Throughout the drawings, like or similar reference numerals indicate like or similar elements.

DETAILED DESCRIPTION

Hereinafter, embodiments of the present disclosure will be described with reference to the accompanying drawings.

It should be understood, however, that the description is only illustrative, and is not intended to limit the scope of the disclosure. In addition, descriptions of well-known structures and techniques are omitted in the following description in order to avoid unnecessarily obscuring the concept of the present disclosure.

Various structures in accordance with embodiments of the present disclosure are schematically depicted in the accompanying drawings. Those figures are not drawn to scale, and some details may be enlarged and some details may be omitted for clarity of illustration. The shapes of various regions and layers, and the relative sizes thereof and the positional relationship therebetween are merely exemplary, and may vary in practice due to fabrication tolerances or technical limitations. Those skilled in the art may design further regions/layers having different shapes, sizes, and relative positions as desired.

In the context of the present disclosure, when a layer/element is referred to as being "on" another layer/element, the layer/element may be directly on the other layer/element, or there may be an intermediate layer/element interposed therebetween In addition, if a layer/element is "above" another layer/element in an orientation, the layer/element may be "under" the other layer/element when the orientation is turned.

Figure 1A:
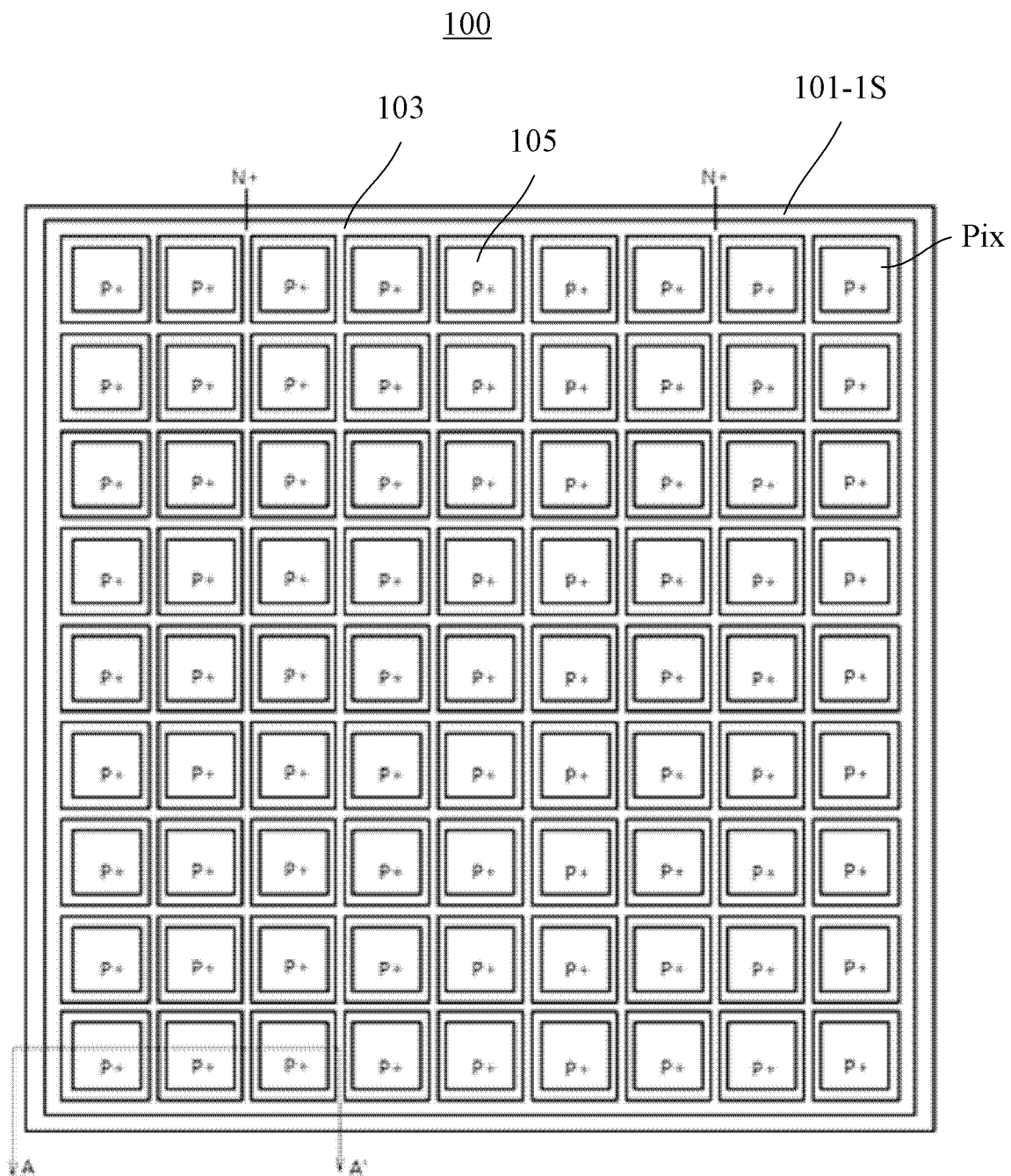
FIG. 1A depicts a top view of a photodiode detector in accordance with an embodiment of the present disclosure.
Figure 1B:
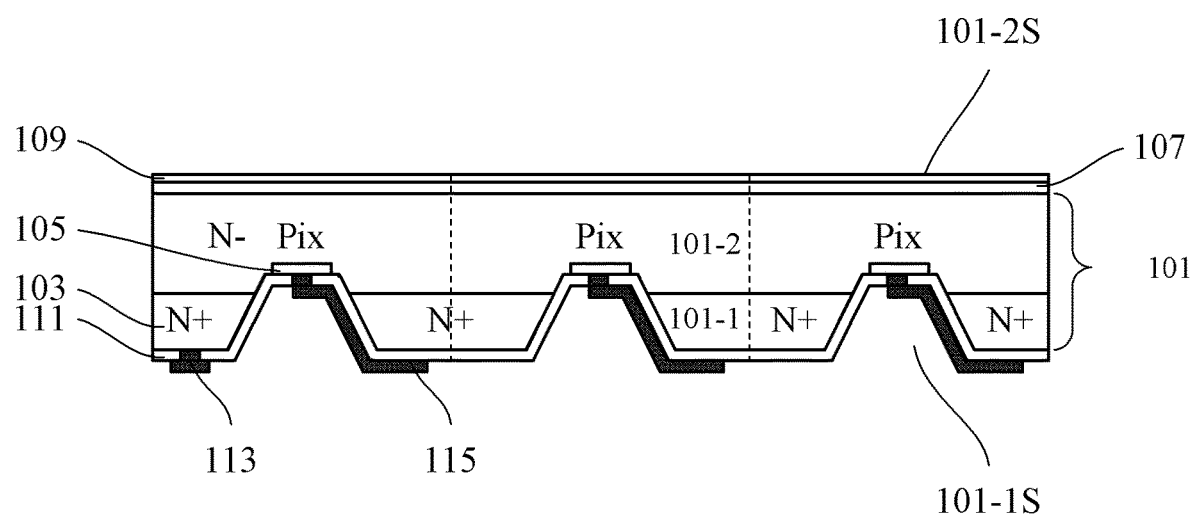
FIG. 1B depicts a cross-sectional view taken along line AA' shown in FIG. 1A.

FIG. 1A depicts a top view of a photodiode detector in accordance with an embodiment of the present disclosure, and FIG. 1B depicts a cross-sectional view taken along line AA' shown in FIG. 1A.

As shown in FIGS. 1A and 1B, a photodiode detector 100 according to the embodiment may include a plurality of photodiode devices Pixs formed on a semiconductor base 101, each of which may constitute one pixel of the photodiode detector 100. The semiconductor base 101 may include various suitable semiconductor materials, such as a monocrystalline wafer (e.g., a silicon (Si) wafer) or an epitaxial wafer (a wafer including an epitaxial layer thereon, for example, a Si wafer including a Si epitaxial layer thereon). The semiconductor base 101 includes two surfaces opposite to each other, a first surface 101-1S and a second surface 101-2S.

The semiconductor base 101 may be doped to a suitable conductivity type, such as a first type (e.g., N-type). Here, the semiconductor base 101 may include different regions 101-1 and 101-2 depending on the doping concentration. For example, in the case of a monocrystalline wafer, the region 101-1 may be a relatively heavily doped region in the wafer, and the region 101-2 may be a relatively lightly doped region in the wafer. In the case of an epitaxial wafer, the region 101-1 may be a relatively heavily doped wafer, and the region 101-2 may be a relatively lightly doped epitaxial layer grown on the wafer 101-1.

The first type heavily doped region 101-1 may serve as a first electrode region 103 of the photodiode device Pix. In addition, the photodiode device Pix may further include a second electrode region 105 on the side of the first surface 101-1S. Here, the second electrode region 105 may be doped to a different conductivity type than the semiconductor base 101, for example, a second type (e.g., P-type), thereby forming a PN junction together with the semiconductor base 101, particularly the region 101-2 therein. As such, in the case where the first type is N-type and the second type is P-type, the second electrode region 105 may constitute an anode of the photodiode device Pix, and the semiconductor base 101 is lead out via the first electrode region 103 and thus may constitute a cathode of the photodiode device Pix. According to an embodiment of the present disclosure, the first electrode region 103 and the second electrode region 105 may be heavily doped. However, due to the presence of the lightly doped region 101-2, the two heavily doped regions can be prevented from being directly adjacent to each other, and thus the tunneling effect can be suppressed.

For example, in the case of a monocrystalline wafer, the semiconductor base 101 may have a thickness of about 200-400 μm, and the first electrode region 103 may have a thickness of about 10-100 μm. In addition, in the case of an epitaxial wafer, the epitaxial layer 101-2 may have a thickness of about 50-150 μm, and the first electrode region 103 may have a thickness of about 10-150 μm. The second electrode region 105 may have a thickness of about 0.5-5 μm. The first electrode region 103 and the second electrode region 105 may be electrically isolated from each other, with a spacing therebetween of, for example, about 10-100 μm.

Incident light may be incident onto the photodiode device Pix from the second surface 101-2S. The photodiode device Pix may operate in a reverse bias mode. In this case, a relatively wide space charge region under the reverse bias condition may be formed in the vicinity of a light collecting active region (the region near the incident surface 101-2S) in the pixel. Alternatively, the photodiode device Pix may operate in a zero bias mode. In this case, a relatively narrow built-in space charge region under the zero bias condition may be formed in the vicinity of the light collecting active region in the pixel. Electrodes may be lead out from the first electrode region 103 and the second electrode region 105, respectively, so as to apply a bias voltage and/or read a signal.

The incident light may collide with and ionize silicon atoms in the semiconductor base 101 (particularly, the region 101-2) in the light collecting active region, thereby generating electron-hole pairs. The electrons may drift or diffuse toward the first electrode region 103 under a built-in electric field or a biasing electric field externally applied, and may eventually be collected by the first electrode region 103. In addition, the holes may drift or diffuse toward the second electrode region 105 under the built-in electric field or the biasing electric field externally applied, and may eventually be collected by the second electrode region 105. An electrical signal may be read from the second electrode region 105, and information about the incident light (e.g., intensity of the incident light) can be obtained therefrom.

According to an embodiment of the present disclosure, the second electrode region 105 may be closer to the side of the second surface 101-2S than the first electrode region 103. In this way, it is possible to reduce the distance between the hole carriers and their collecting mechanism, and thus to accelerate the absorption of the hole carriers and reduce the trapping of the carriers by defects of the semiconductor base, so as to increase the photo induced output current. On the other hand, the overall thickness of the photodiode detector 100 can still remain relatively great, to maintain a certain mechanical strength. This can be achieved, for example, by recessing the second electrode region 105 on the side of the first surface 101-1S. As will be described below, such a recess may be a trench structure.

Here, doping in the respective regions may be performed by means of ion implantation, in-situ doping during epitaxial growth, or the like. There are various ways in the art to form a specific type doped region in/on a defined region of a semiconductor base. In the photodiode device Pix, the first electrode region 103 may surround the second electrode region 105. In addition, in the photodiode detector 100, the first electrode regions 103 of the respective photodiode devices Pixs may be connected to each other, such that they may be formed integral with each other. The second electrode regions 105 of the respective photodiode devices Pixs may be separated from each other and arranged, for example, in an array form in rows and columns.

Here, the terms "heavily doped" and "lightly doped" are relative terms. For example, "heavily doped" means a doping concentration of about $1\times10^{17}$ cm$^{-3}$ or above, and "lightly doped" means a doping concentration of about $1\times10^{17}$ cm$^{-3}$ or below. In addition, the first type lightly doped region 101-2 may have a high resistance, such as a resistivity of about 100–$8\times10^3$ Ω·cm. To conduct the first type (e.g., N-type) of doping, N-type dopants such as phosphorus (P) or arsenic (As) may be used; and to conduct the second type (e.g., P-type) of doping, P-type dopants such as boron (B) may be used.

On the side of the second surface 101-2S, a relatively thin layer of a first type heavily doped region 107 may be formed. For example, the first type heavily doped region 107 may have a thickness of about 0.2-1 μm. With the thin layer of the first type heavily doped region 107, it is possible to prevent the photo-generated carriers from being recombined by defects existing at a silicon-oxygen interface. In addition, an insulating layer 109 may be formed on the first type heavily doped region 107. The insulating layer 109 may include a dielectric material such as silicon dioxide, silicon nitride, or a combination thereof. In the photodiode detector 100, the first type heavily doped regions 107 and the insulating layers 109 of the respective photodiode devices Pixs on the side of the second surfaces 101-2S may continuously extend.

On the side of the first surface 101-1S, a passivation layer 111 may be formed to cover and protect the first electrode region 103 and the second electrode region 105. The passivation layer 111 may include a dielectric material such as silicon dioxide, silicon nitride, or a combination thereof. The passivation layer 111 may be formed to be relatively thin, for example, in a substantially conformal manner, on the side of the first surface 101-1S, or alternatively may be formed to be relatively thick to, for example, fill up a trench corresponding to the second electrode region 105. The passivation layer 111 may continuously extend on the side of the first surface 101-1S. In the passivation layer 111, contact holes penetrating through the passivation layer 111 that correspond to the first electrode region 103 and the second electrode region 105, respectively, may be formed. Electrical contacts 113, 115 passing through such contact holes may be formed so as to lead out the first electrode region 103 and the second electrode region 105, for desired electrical connections. The electrical contacts 113, 115 may include a conductive material, for example, a metal such as copper (Cu), tungsten (W), or the like. In the example, a common electrical contact 113 to the common first electrode region 103 may be formed for the photodiode detector 100, since the first electrode regions 103 of the respective photodiode devices Pixs in the photodiode detector 100 are integrally connected to each other. Certainly, one or more common electrical contacts 113 may be formed depending on the scale and layout of the photodiode detector 100.

It should be noted here that the passivation layer 111 and the contacts 113, 115 are not shown in the top view of FIG. 1A for the sake of clarity.

FIGS. 2A-2J are cross-sectional views depicting some stages in a process of fabricating the photodiode detector shown in FIGS. 1A and 1B, in accordance with an embodiment of the present disclosure.

Figure 2A:
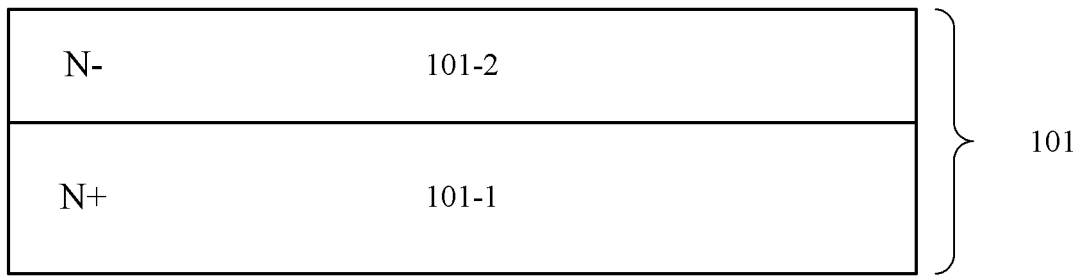
FIGS. 2A-2J are cross-sectional views depicting some stages in a process of fabricating the photodiode detector shown in FIGS. 1A and 1B, in accordance with an embodiment of the present disclosure.

As shown in FIG. 2A, a semiconductor base 101 in the form of an epitaxial wafer is provided. The epitaxial wafer 101 may include a semiconductor substrate 101-1 such as a silicon wafer. The substrate 101-1 may be first type (e.g., N-type) heavily doped, and include two surfaces (upper and lower surfaces shown in FIG. 2A) opposite to each other. An epitaxial layer 101-2 may be epitaxially grown on the upper surface of the substrate 101-1. The epitaxial layer 101-2 may be in-situ doped while being grown, and thus may be first type lightly doped.

Although the epitaxial wafer is described by way of example here, the present disclosure is not limited thereto. For example, a monocrystalline wafer 101 may be provided and the wafer 101 may be first type (e.g., N-type) lightly doped. Then, at a surface on one side of the wafer 101, a first type heavily doped region 101-1 may be formed by, for example, a contact diffusion method (the remaining region that is still first type lightly doped is labeled 101-2). The wafer 101 may be a single-side polished wafer or a both-sides polished wafer. In the case of a single-side polished wafer, the diffusion doping may be performed on an unpolished surface; and in the case of a both-sides polished wafer, the diffusion doping may be performed on either surface. Some surface damages caused by back grinding may be eliminated by forming a relatively thick N+ region by the contact diffusion.

Figure 2B:
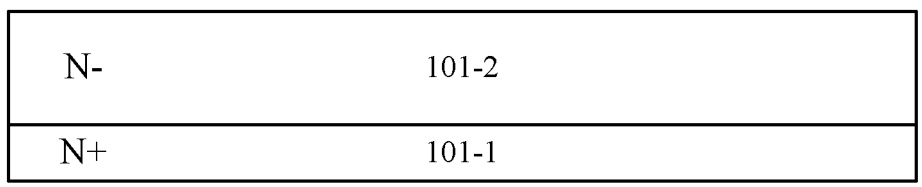

Then, as shown in FIG. 2B, the substrate 101-1 may be ground so as to reduce the thickness of the epitaxial wafer 101 to, for example, about 150-250 μm. The ground surface may be polished by, for example, chemical etching polishing, for further treatment.

According to an embodiment of the present disclosure, the thickness of the thinned substrate may be determined according to the thickness of the epitaxial layer. For example, if the epitaxial layer is relatively thick (e.g., greater than about 100 μm), the substrate may be thinned to a relatively small thickness (e.g., less than about 50 μm); or if the epitaxial layer is relatively thin (e.g., less than about 50 μm), the substrate may be thinned to a relatively great thickness (e.g., greater than about 100 μm). On the other hand, the total thickness of the semiconductor base 101 may be maintained to be about 150-250 μm.

In addition, the influence of particle contamination on quantum efficiency can be reduced, since the first type heavily doped substrate 101-1 is ground without grinding the epitaxial layer 101-2.

The first type heavily doped substrate 101-1 may then be used as the first electrode region of the photodiode device. The first type heavily doped substrate 101-1 may be patterned according to an array layout, so as to form trenches for forming second electrode regions therein. In order to make the second electrode regions contact with the epitaxial layer 101-2 to form PN junctions and also better separate from the first electrode region, the trenches may penetrate through the first type heavily doped substrate 101-1 and extend into the first type lightly doped epitaxial layer 101-2. Then, the second electrode regions may be formed within the respective trenches, for example, at the bottom of the respective trenches.

This may be realized, for example, as follows.

Figure 2C:
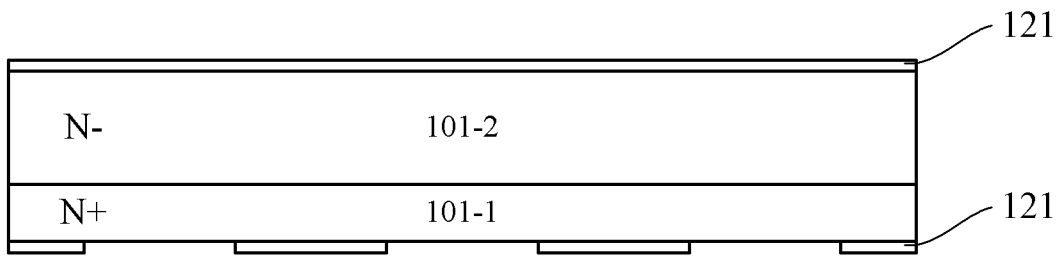

Specifically, as shown in FIG. 2C, oxide layers 121 may be formed on the opposite surfaces (upper and lower surfaces shown in FIG. 2C) of the epitaxial wafer 101 by, for example, thermal oxidation. Then, a series of openings may be formed in the oxide layer 121 on the surface at the substrate 101-1 side (the lower surface shown in FIG. 2C) by photolithography. The series of openings correspond to positions of the second electrode regions to be formed subsequently. The oxide layer 121 on the lower surface with the openings formed therein may then be used as a mask layer in etching the trenches, and the oxide layer 121 on the upper surface may then protect the upper surface in etching the trenches.

Figure 2D:
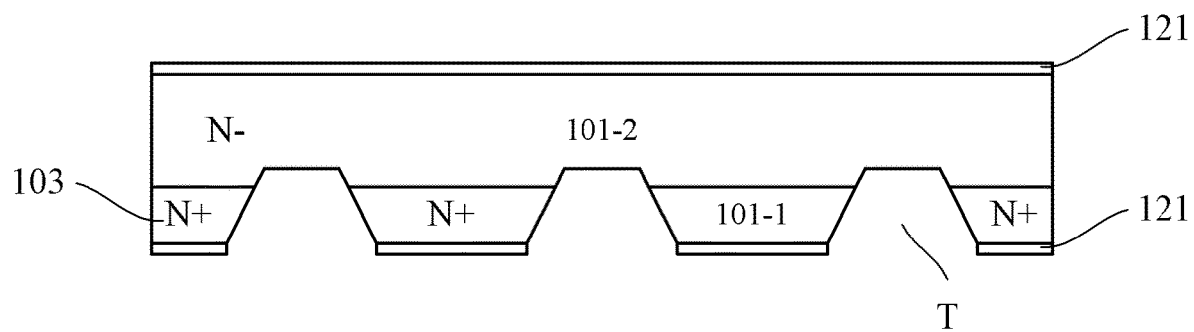

Then, as shown in FIG. 2D, the epitaxial wafer 101 may be etched by, for example, wet etching. For example, the epitaxial wafer 101 may be immersed in a silicon etching solution such as KOH, TMAH or HF-HNO$_3$. Trenches T may be etched on the lower surface side, due to the openings in the oxide layer 121 on the lower surface. Due to the wet etching, the trenches T may each have a cross section tapered from the lower surface side toward the upper surface side. According to an embodiment of the present disclosure, the etching duration may be controlled such that the trenches T may each have a depth exceeding the thickness of the first type heavily doped substrate 101-1 (e.g., the depth of the trenches T is greater than the thickness of the first type heavily doped substrate 101-1 by about 5-10 µm), and thus the trenches T may penetrate through the first type heavily doped substrate 101-1 and extend into the first type lightly doped epitaxial layer 101-2. The patterned first type heavily doped substrate 101-1 may then be used as the first electrode region 103.

Figure 2E:
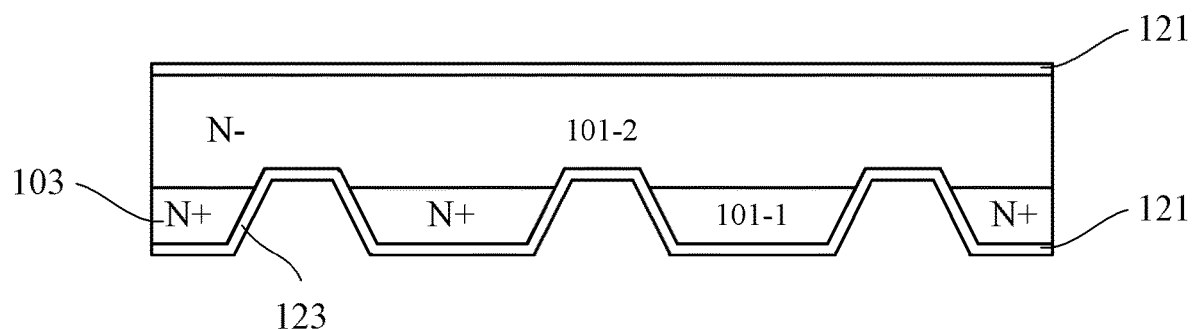

Next, as shown in FIG. 2E, oxide layers 123 may be formed on both the upper and lower surfaces of the epitaxial wafer 101 by, for example, thermal oxidation. Here, the oxide layers 123 are shown as being integral with the oxide layers 121 for the sake of convenience. According to an embodiment of the present disclosure, the oxide layers 121 may be removed by cleaning, and then the oxide layers 123 may be formed by thermal oxidation. Alternatively, the oxide layers 123 may be directly formed by thermal oxidation without removing the oxide layers 121 (in this case, the oxide layers 121 may become thicker). With such thermal oxidation process, burrs or damages on sidewalls of the trenches T caused by the etching can be removed, thereby further smoothing the sidewalls of the trenches.

Figure 2F:
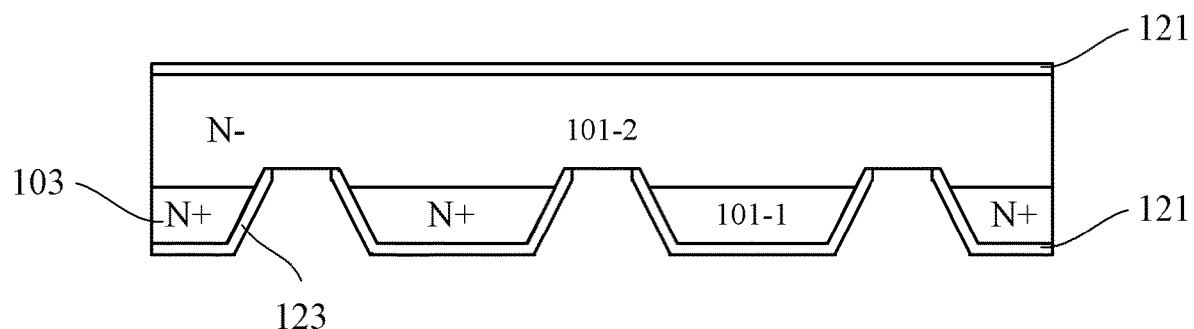
Figure 2G:
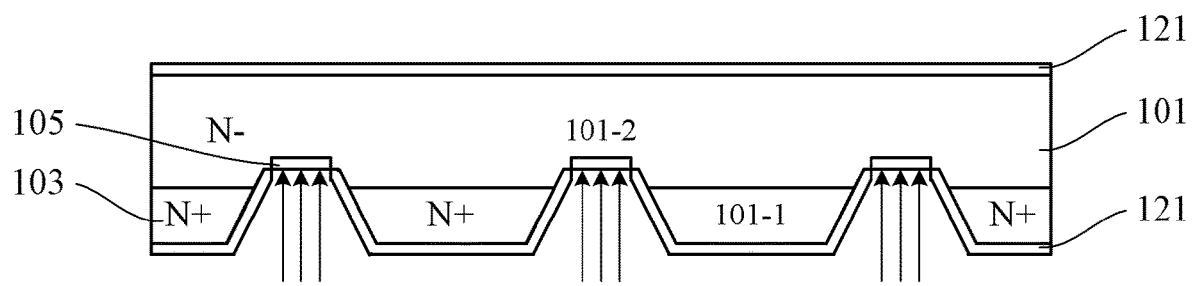

Then, the oxide layer may be patterned so as to at least partially expose the bottom regions of the trenches. For example, as shown in FIG. 2F, a series of openings may be formed at positions where the second electrode regions are to be formed in the oxide layer 121/123 on the lower surface side by photolithography. In order to better separate from the first electrode region, those openings may be formed at, for example, approximately the center of the bottom regions of the respective trenches, with ends thereof inwardly retracted relative to the respective trench sidewalls. Next, as shown in FIG. 2G, second type heavily doped regions 105 may be formed on the lower surface side by ion implantation (e.g., implantation of B or BF$_2$) through the openings in the oxide layer 121/123 (the implanted ions may be activated by annealing), and the formed second type heavily doped regions 105 may then be used as the second electrode regions. Then, the oxide layer 121/123 may be removed by cleaning.

Figure 2H:
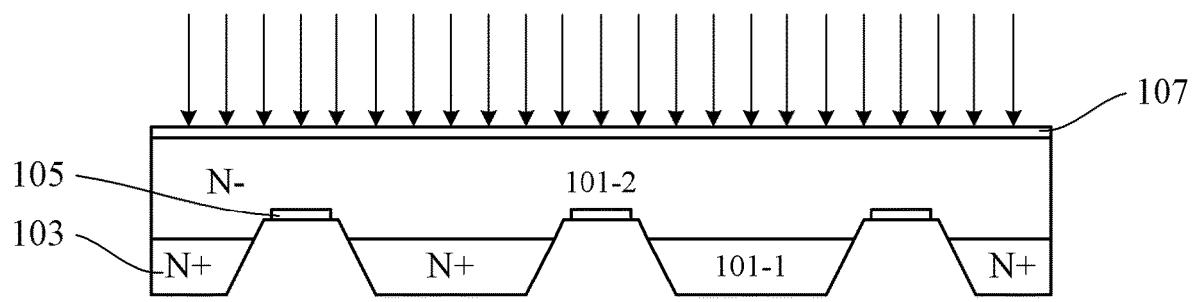

In addition, as shown in FIG. 2H, a first type heavily doped region 107 may be formed on the surface of the epitaxial layer 101-2 facing away from the substrate 101-1 side by ion implantation (for example, implantation of P or As with an implantation depth of about 0.2-1 µm). In addition, an insulating layer 109 may be formed on the first type heavily doped region 107. For example, a thin layer of oxide may be formed on the first type heavily doped region 107 by thermal oxidation. The implanted impurity ions may also be activated during the thermal oxidation.

Figure 2I:
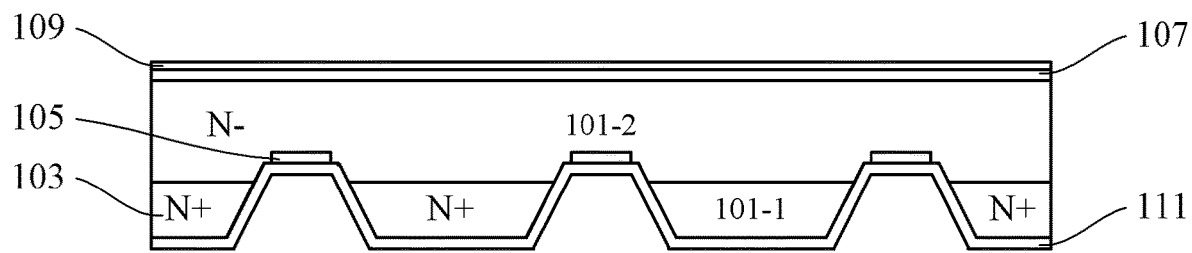

Further, as shown in FIG. 2I, a passivation layer 111 may be formed on the lower surface side so as to cover the first electrode region 103 and the second electrode regions 105. For example, a silicon dioxide layer may be formed on the lower surface side by deposition such as chemical vapor deposition (CVD). In the example, the deposited silicon dioxide layer 111 is relatively thin and thus may be formed on the lower surface side in a substantially conformal manner (having substantially the same or similar fluctuations as the underlying structure).

Figure 2J:
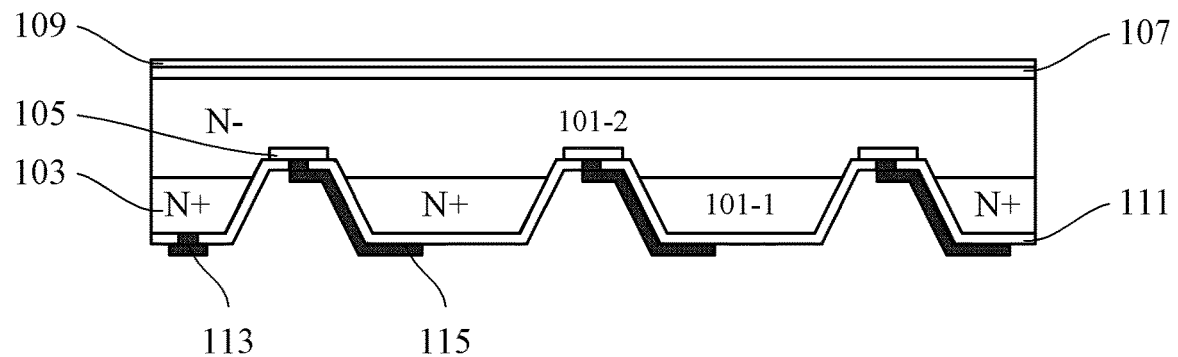

Contacts 113, 115 to the first electrode region 103 and the second electrode regions 105 may be fabricated so as to lead them out. For example, as shown in FIG. 2J, contact holes penetrating through the passivation layer 111 may be formed in the passivation layer 111 at positions corresponding to the first electrode region 103 and the second electrode regions 105 by photolithography. Then, a conductive material such as a metal may be formed on the passivation layer 111. The conductive material fills the contact holes, and thus is connected to the first electrode region 103 and the second electrode regions 105. The conductive material may be patterned into separate electrodes by photolithography.

Figure 3:
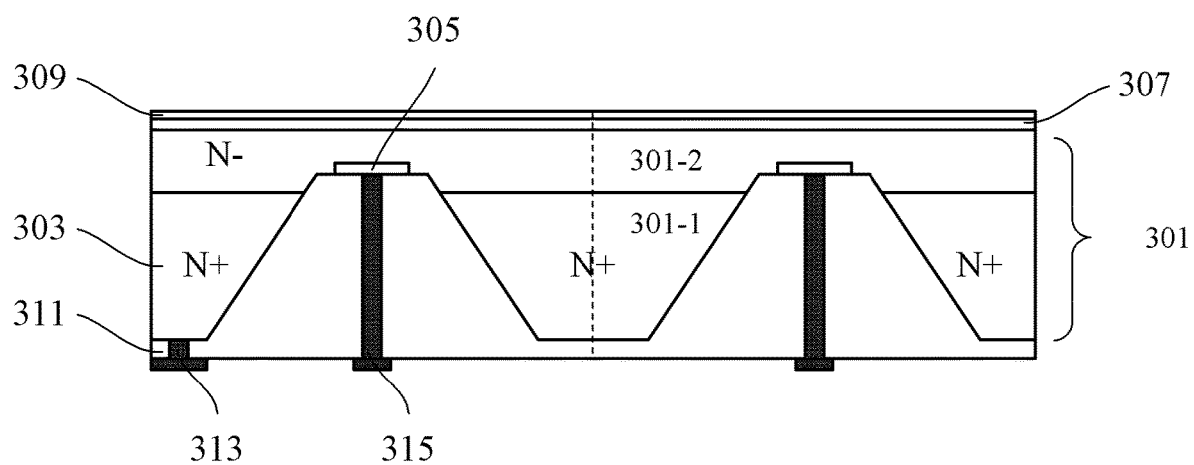
FIG. 3 depicts a cross-sectional view of a photodiode detector in accordance with another embodiment of the present disclosure.

FIG. 3 depicts a cross-sectional view of a photodiode detector in accordance with another embodiment of the present disclosure.

As shown in FIG. 3, the photodiode detector according to this embodiment may include a plurality of photodiode devices formed on a semiconductor base 301. As described above, the semiconductor base 301 may be an epitaxial wafer including a first type heavily doped substrate 301-1 (having a thickness of, for example, about 150-350 µm) and a first type lightly doped epitaxial layer 301-2 (having a thickness of, for example, about 20-50 µm) grown on the substrate 301-1. The substrate 301-1 may serve as a first electrode region 303 of the respective photodiode devices, and each of the photodiode devices may further include a second electrode region 305. The second electrode region 305 may be second type heavily doped (having a thickness of, for example, about 0.5-5 µm).

A first type heavily doped region 307 and an insulating layer 309 may be formed on a surface of the epitaxial layer 301-2 facing away from the substrate 301-1. In addition, a passivation layer 311 may be formed on the substrate 301-1 side. Contacts 313 and 315 may penetrate through the passivation layer 311 and may be electrically connected to the first electrode region 303 and the second electrode regions 305, respectively. Regarding these components, reference can be made to the above description. In this example, the passivation layer 311 is formed to be relatively thick and may have a substantially flat surface.

FIGS. 4A-4I are cross-sectional views depicting some stages in a process of fabricating the photodiode detector shown in FIG. 3, in accordance with an embodiment of the present disclosure.

Figure 4A:
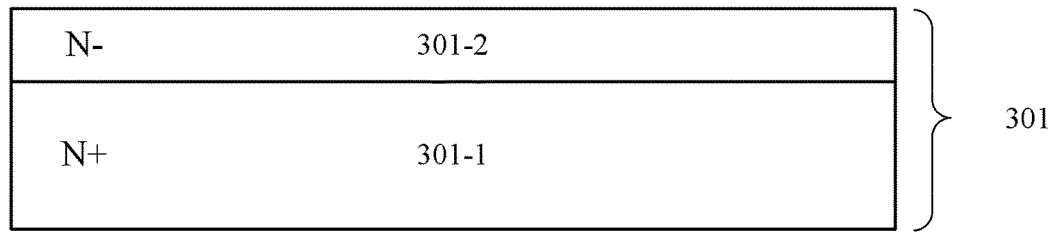
FIGS. 4A-4I are cross-sectional views depicting some stages in a process of fabricating the photodiode detector shown in FIG. 3, in accordance with an embodiment of the present disclosure.

As shown in FIG. 4A, an epitaxial wafer 301, such as a silicon epitaxial wafer, is provided. The epitaxial wafer 301 may include a first type heavily doped substrate 301-1 and an epitaxial layer 301-2 grown on the substrate 301-1. The substrate 301-1 is ground such that the epitaxial wafer 301 has a total thickness of about 150-250 µm. As described above, the thickness of the thinned substrate may be determined according to the thickness of the epitaxial layer.

Figure 4B:
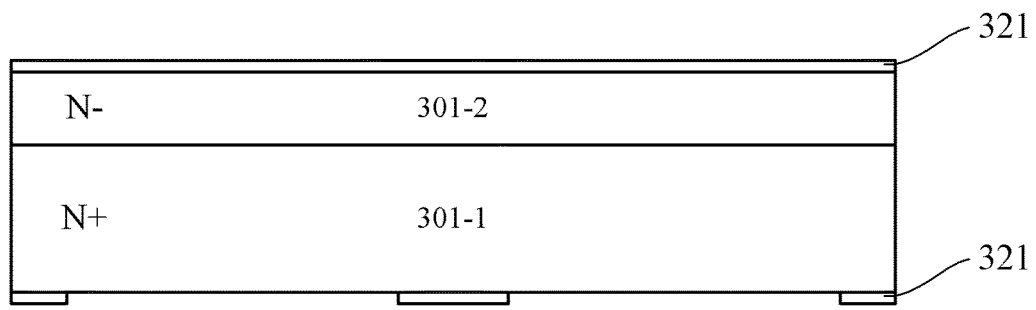

As shown in FIG. 4B, oxide layers 321 may be formed on opposite surfaces (upper and lower surfaces shown in FIG. 4B) of the epitaxial wafer 301 by, for example, thermal oxidation. Then, a series of openings may be formed in the oxide layer 321 on the surface at the substrate 101-1 side (the lower surface shown in FIG. 4B) by photolithography. The series of openings correspond to positions of the second electrode regions to be formed subsequently.

Figure 4C:
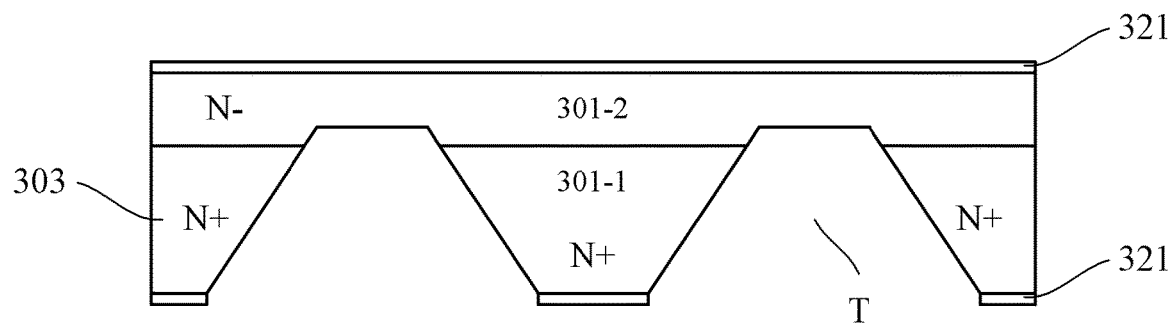

Then, as shown in FIG. 4C, the epitaxial wafer 301 may be etched by, for example, wet etching. Trenches T may be etched on the lower surface side, due to the openings in the oxide layer 321 on the lower surface. As described above, the trenches T may each have a cross section tapered from the lower surface side toward the upper surface side. Likewise, the trenches T may each have a depth exceeding the thickness of the first type heavily doped substrate 301-1 (e.g., the depth of the trenches T is greater than the thickness of the first type heavily doped substrate 301-1 by about 5-10 μm), and thus the trenches T may penetrate through the first type heavily doped substrate 301-1 and extend into the first type lightly doped epitaxial layer 301-2. The patterned first type heavily doped substrate 301-1 may then be used as the first electrode region 303.

Figure 4D:
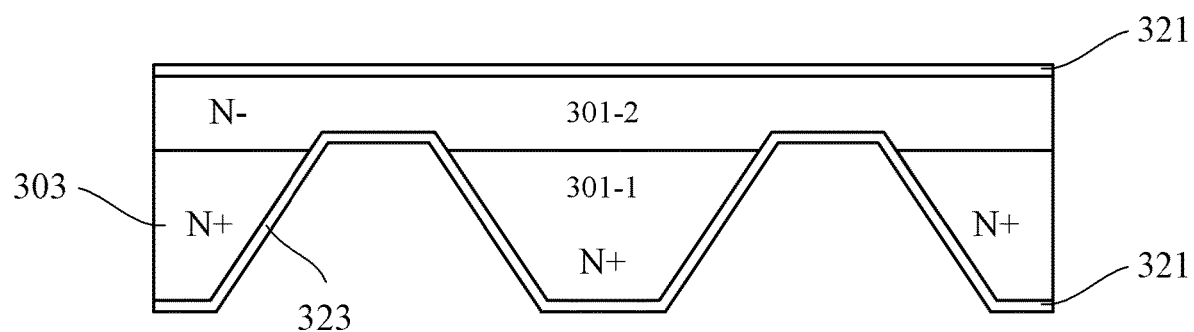

Next, as shown in FIG. 4D, oxide layers 323 may be formed on both the upper and lower surfaces of the epitaxial wafer 301 by, for example, thermal oxidation. Here, the oxide layers 323 are shown as being integral with the oxide layers 321 for the sake of convenience. With such thermal oxidation process, burrs or damages on sidewalls of the trenches T caused by the etching can be removed, thereby further smoothing the sidewalls of the trenches.

Figure 4E:
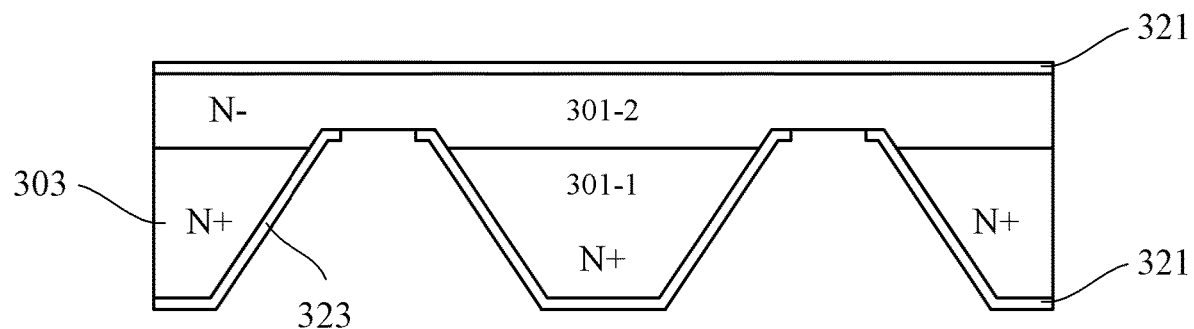
Figure 4F:
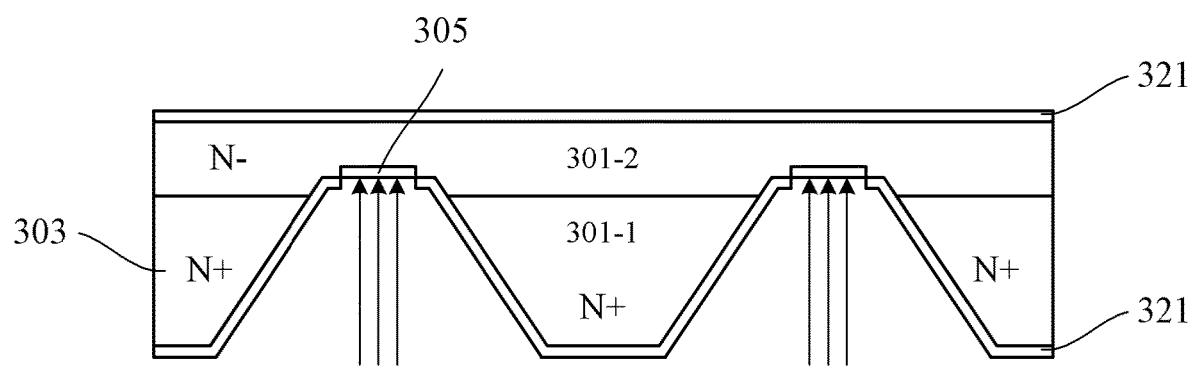

Then, as shown in FIG. 4E, a series of openings may be formed at positions where the second electrode regions are to be formed in the oxide layer 321/323 on the lower surface side by photolithography. Next, as shown in FIG. 4F, second type heavily doped regions 305 may be formed on the lower surface side by ion implantation through the openings in the oxide layer 321/323 (the implanted ions may be activated by annealing), and the formed second type heavily doped regions 305 may then be used as the second electrode regions. Then, the oxide layers 321/323 may be removed by cleaning.

Figure 4G:
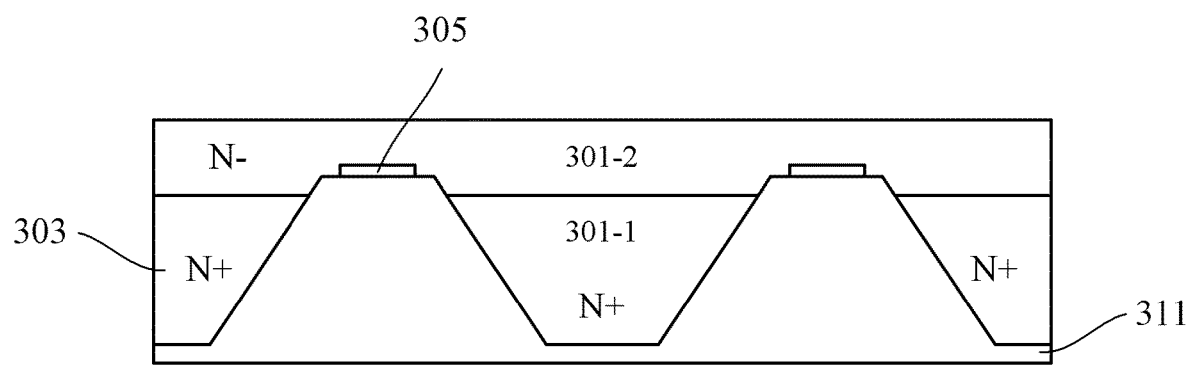

In addition, as shown in FIG. 4G, a passivation layer 311 may be formed on the lower surface side so as to cover the first electrode region 303 and the second electrode regions 305. In this example, the deposited silicon dioxide layer 311 is relatively thick so that it can completely fill up the trenches and extend beyond the lower surface of the epitaxial wafer 301. The passivation layer 311 may be subjected to a planarization process such as chemical mechanical polishing (CMP).

Figure 4H:
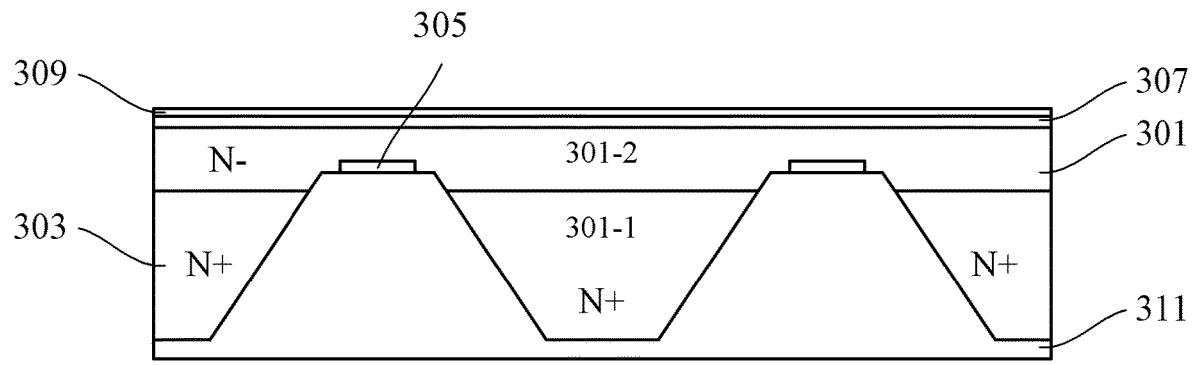

In addition, as shown in FIG. 4H, a first type heavily doped region 307 may be formed on the surface of the epitaxial layer 301-2 facing away from the substrate 301-1 side by ion implantation. In addition, an insulating layer 309 may be formed on the first type heavily doped region 307. For example, a thin layer of oxide may be formed on the first type heavily doped region 307 by thermal oxidation. The implanted impurity ions may also be activated during the thermal oxidation.

Figure 4I:
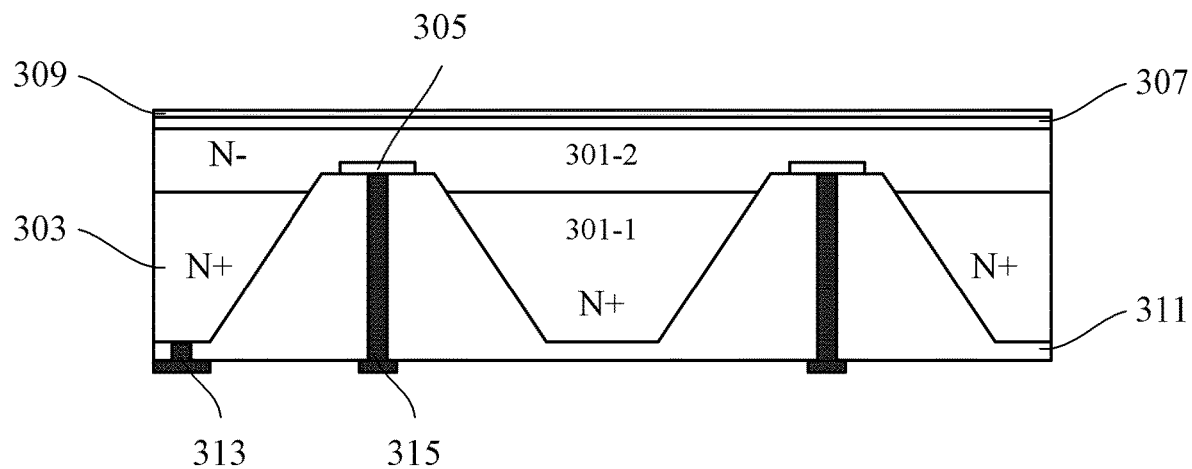

Contacts 313, 315 to the first electrode region 303 and the second electrode regions 305 may be fabricated so as to lead them out. For example, as shown in FIG. 4I, contact holes penetrating through the passivation layer 311 may be formed in the passivation layer 311 at positions corresponding to the first electrode region 303 and the second electrode regions 305 by photolithography. Then, a conductive material such as a metal may be formed on the passivation layer 311. The conductive material fills the contact holes, and thus is connected to the first electrode region 303 and the second electrode regions 305. The conductive material may be patterned into separate electrodes by photolithography.

Figure 4J:
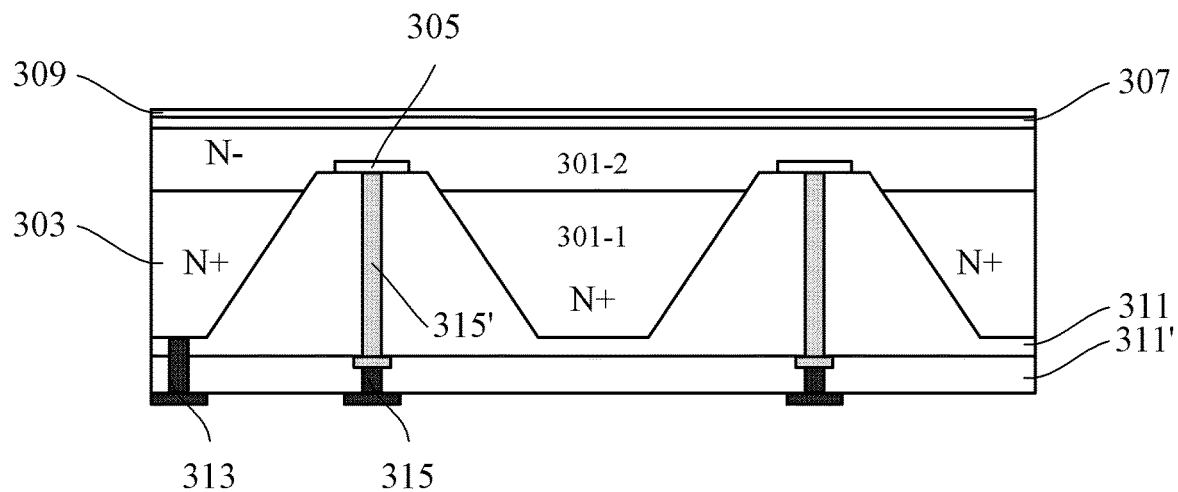
FIG. 4J depicts a cross-sectional view of a contact in accordance with another embodiment of the present disclosure.

According to another embodiment of the present disclosure, as shown in FIG. 4J, after the contact holes are formed in the passivation layer 311, a second type heavily doped semiconductor material such as polysilicon may be grown therein. The semiconductor material may be patterned into separate portions 315' by photolithography. Then, a dielectric layer 311' may be formed on the passivation layer 311. In a similar manner, contacts 313, 315 that are electrically connected to the first electrode region 303 and the doped semiconductors 315', respectively, may be formed in the dielectric layer 311'. This can avoid the difficulty of filling metal in deep contact holes.

Although the contact 313 to the first electrode region 303 is illustrated as being integrally formed of a metal material in the example of FIG. 4J, the present disclosure is not limited thereto. For example, the contact 313 may be formed in the same manner as the contacts 315, and thus may also include a stack structure of doped semiconductor and metal.

Figure 5:
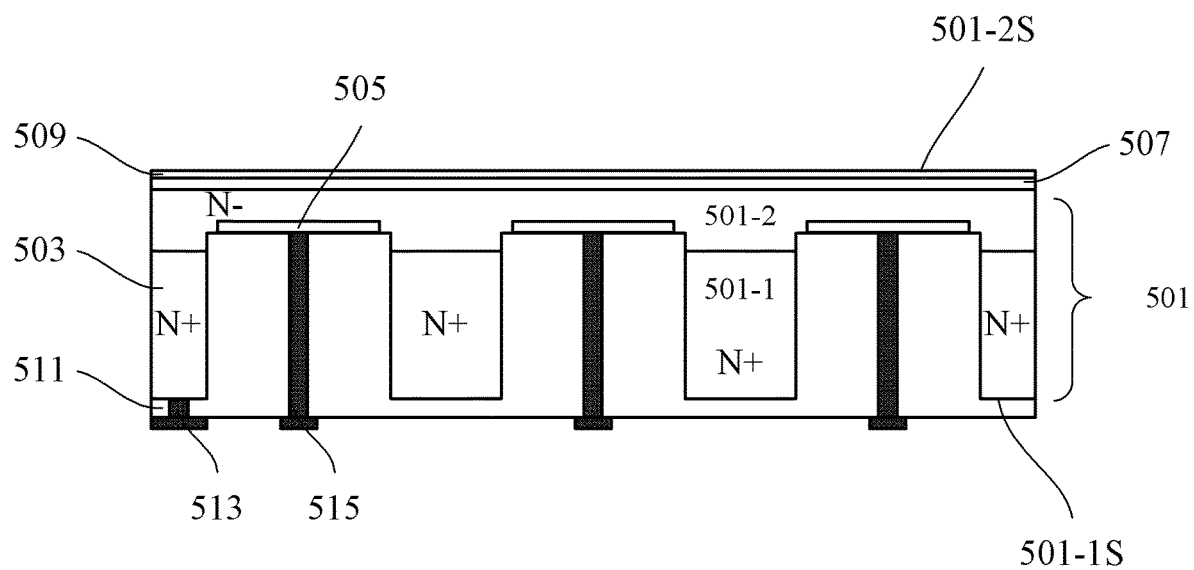
FIG. 5 depicts a cross-sectional view of a photodiode detector in accordance with another embodiment of the present disclosure.

FIG. 5 depicts a cross-sectional view of a photodiode detector in accordance with another embodiment of the present disclosure.

As shown in FIG. 5, the photodiode detector according to the present embodiment may include a plurality of photodiode devices formed on a semiconductor base 501. As described above, the semiconductor base 501 may be an epitaxial wafer including a first type heavily doped substrate 501-1 (having a thickness of, for example, about 150-350 μm) and a first type lightly doped epitaxial layer 501-2 (having a thickness of, for example, about 20-50 μm) grown on the substrate 501-1. The substrate 501-1 may serve as a first electrode region 503 of the respective photodiode devices, and each of the photodiode devices may further include a second electrode region 505. The second electrode region 505 may be second type heavily doped (having a thickness of, for example, about 0.5-5 μm).

A first type heavily doped region 507 and an insulating layer 509 may be formed on a surface of the epitaxial layer 501-2 facing away from the substrate 501-1. A passivation layer 511 may be formed on the substrate 501-1 side. Contacts 513 and 515 may penetrate through the passivation layer 511 and may be electrically connected to the first electrode region 503 and the second electrode regions 505, respectively. Regarding these components, reference can be made to the above description.

The configuration of this embodiment is substantially the same as that shown above in FIG. 3, except that the trenches used to form the second electrode regions 505 have substantially vertical sidewalls.

FIGS. 6A-6I are cross-sectional views depicting some stages in a process of fabricating the photodiode detector shown in FIG. 5, in accordance with an embodiment of the present disclosure.

Figure 6A:
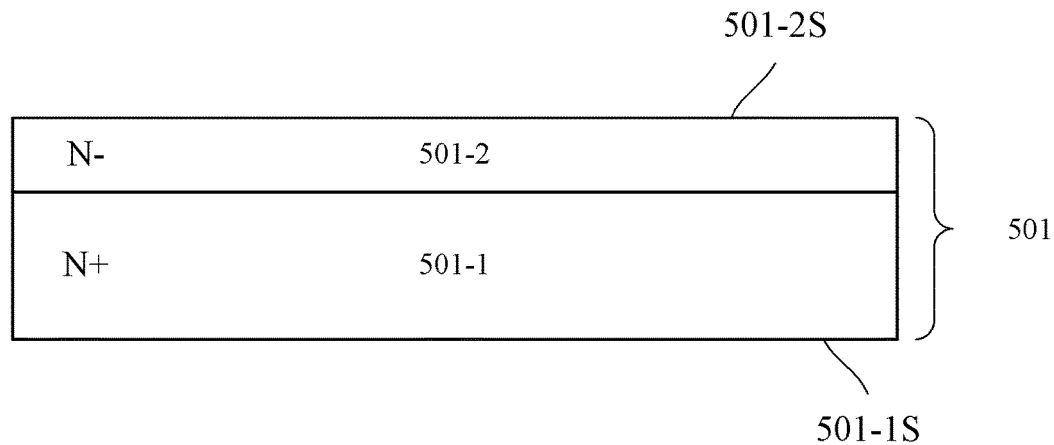
FIGS. 6A-6I are cross-sectional views depicting some stages in a process of fabricating the photodiode detector shown in FIG. 5, in accordance with an embodiment of the present disclosure.

As shown in FIG. 6A, an epitaxial wafer 501 such as a silicon epitaxial wafer is provided. The epitaxial wafer 501 may include a first type heavily doped substrate 501-1 and an epitaxial layer 501-2 grown on the substrate 501-1. The substrate 501-1 is ground such that the epitaxial wafer 501 has a total thickness of about 150-250 μm. As described above, the thickness of the thinned substrate may be determined according to the thickness of the epitaxial layer.

Figure 6B:
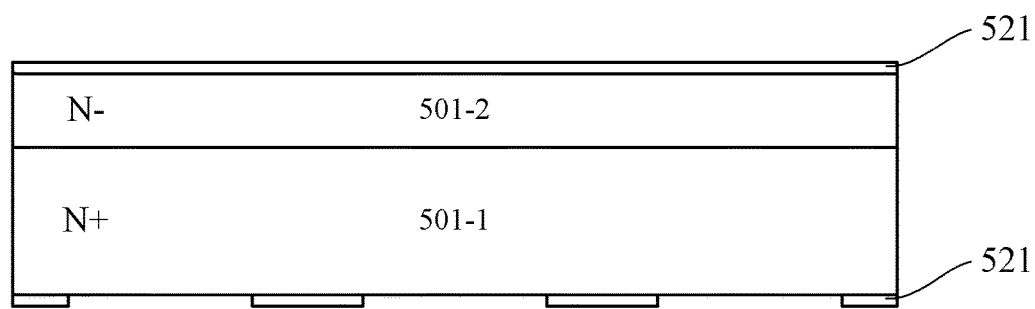

As shown in FIG. 6B, oxide layers 521 may be formed on opposite surfaces (upper and lower surfaces shown in FIG. 6B) of the epitaxial wafer 501 by, for example, thermal oxidation. Then, a series of openings may be formed in the oxide layer 521 on the surface at the substrate 501-1 side (the lower surface shown in FIG. 6B) by photolithography. The series of openings correspond to positions of the second electrode regions to be formed subsequently.

Figure 6C:
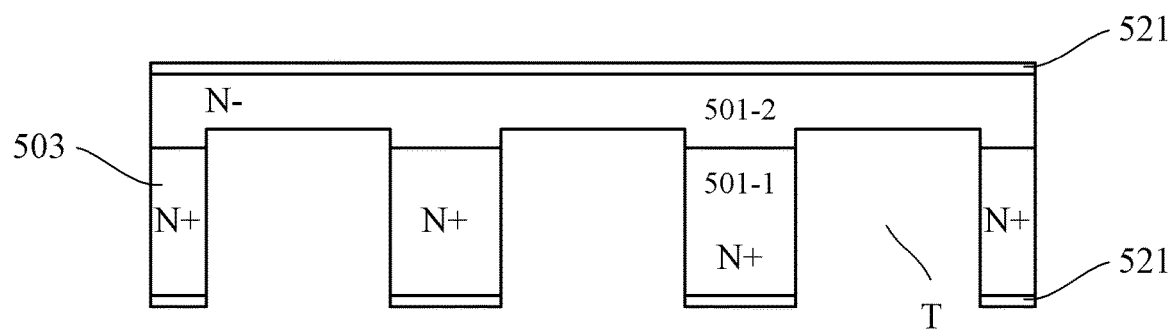

Then, as shown in FIG. 6C, the epitaxial wafer 501 may be etched. Trenches T may be etched on the lower surface side, due to the openings in the oxide layer 521 on the lower surface. Here, dry etching such as reactive ion etching (RIE) may be utilized. Thus, the trenches T may have substantially vertical sidewalls. Likewise, the trenches T may each have a depth exceeding the thickness of the first type heavily doped substrate 501-1 (e.g., the depth of the trenches T is greater than the thickness of the first type heavily doped substrate 501-1 by about 5-10 μm) and thus the trenches T may penetrate through the first type heavily doped substrate 501-1 and extend into the first type lightly doped epitaxial layer 501-2. The patterned first type heavily doped substrate 501-1 may then be used as the first electrode region 503.

Figure 6D:
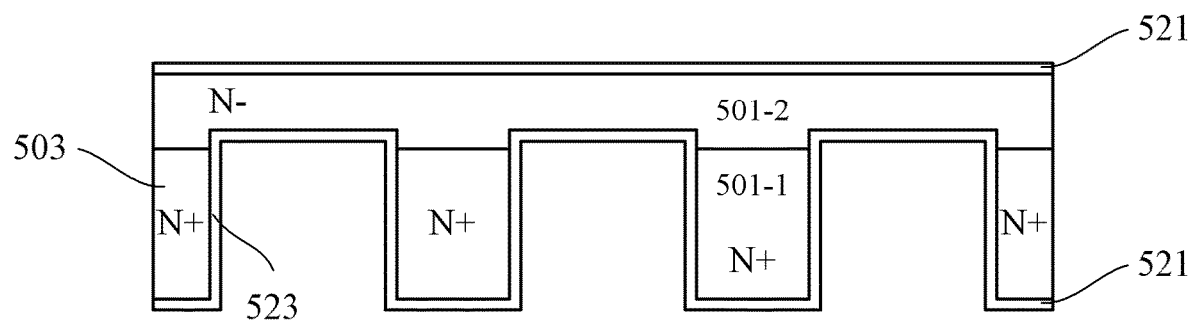

Next, as shown in FIG. 6D, oxide layers 523 may be formed on both the upper and lower surfaces of the epitaxial wafer 501 by, for example, thermal oxidation. Here, the oxide layers 523 are shown as being integral with the oxide layers 521 for the sake of convenience. With such thermal oxidation process, burrs or damages on sidewalls of the trenches T caused by the etching can be removed, thereby further smoothing the sidewalls of the trenches.

Figure 6E:
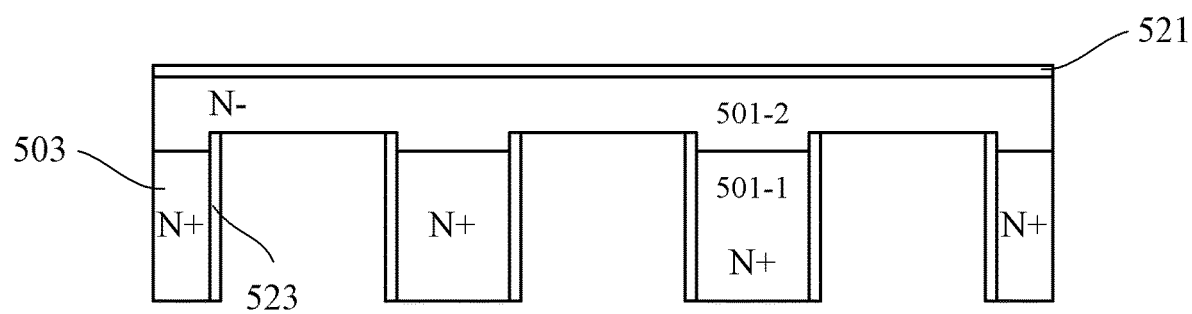
Figure 6F:
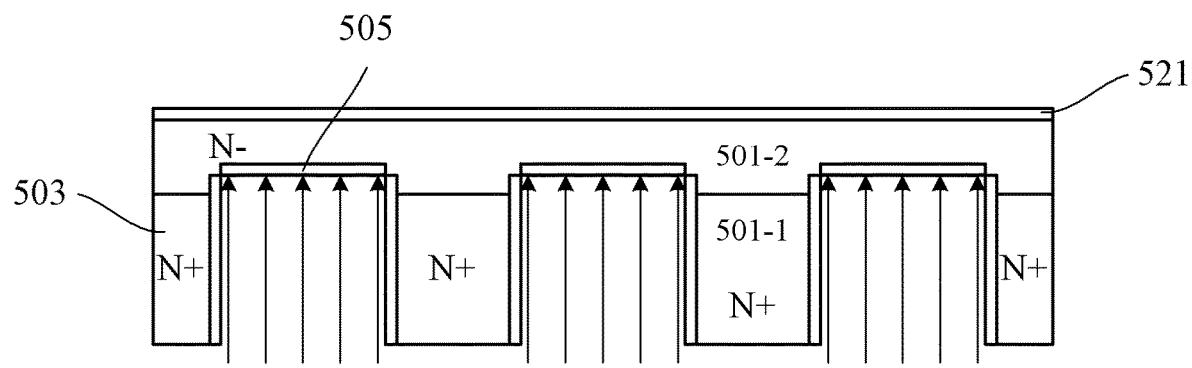

Then, as shown in FIG. 6E, laterally extending portions of the oxide layer 521/523 may be removed, while leaving its vertically extending portions, by RIE in a direction substantially perpendicular to a surface 501-1S of the base. As a result, the sidewalls of the trenches T may be covered by the oxide layer 523, and the bottoms thereof may be exposed. Next, as shown in FIG. 6F, second type heavily doped regions 505 may be formed on the lower surface side by ion implantation (the implanted ions may be activated by annealing), and the formed second type heavily doped regions 505 may then be used as the second electrode regions. Then, the oxide layers 521/523 may be removed by cleaning.

Figure 6G:
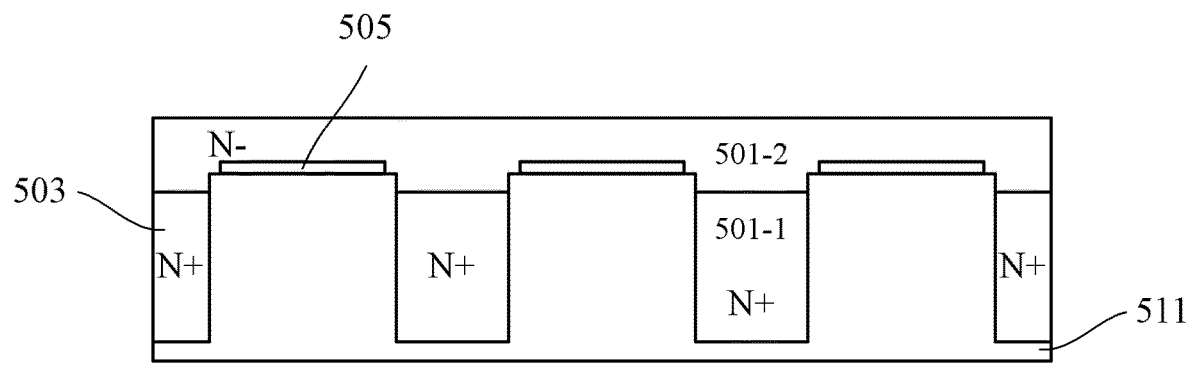

In addition, as shown in FIG. 6G, a passivation layer 511 may be formed on the lower surface side so as to cover the first electrode region 503 and the second electrode regions 505. In this example, the deposited silicon dioxide layer 511 is relatively thick so that it can completely fill up the trenches and extend beyond a second surface 501-1S of the epitaxial wafer 501. The passivation layer 511 may be subjected to a planarization process such as CMP.

Figure 6H:
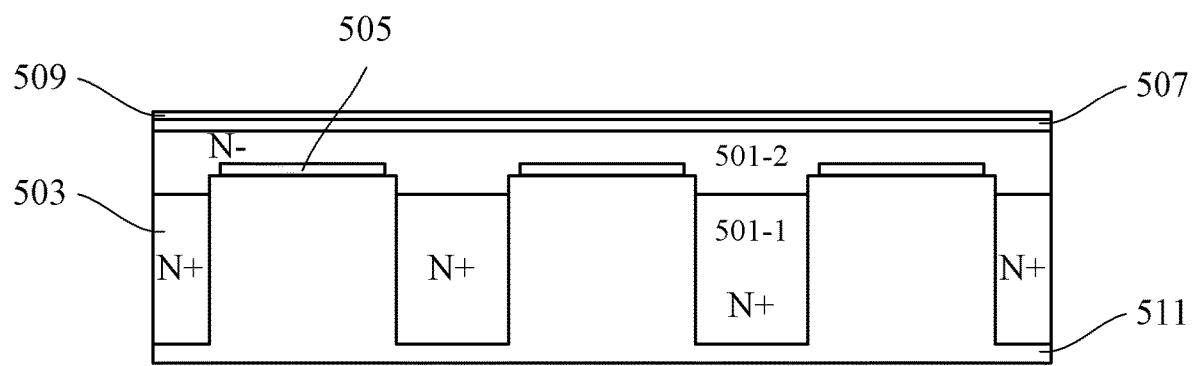

In addition, as shown in FIG. 6H, a first type heavily doped region 507 may be formed on the surface of the epitaxial layer 501-2 facing away from the substrate 501-1 side by ion implantation. In addition, an insulating layer 509 may be formed on the first type heavily doped region 507. For example, a thin layer of oxide may be formed on the first type heavily doped region 507 by thermal oxidation. The implanted impurity ions may also be activated during the thermal oxidation.

Figure 6I:
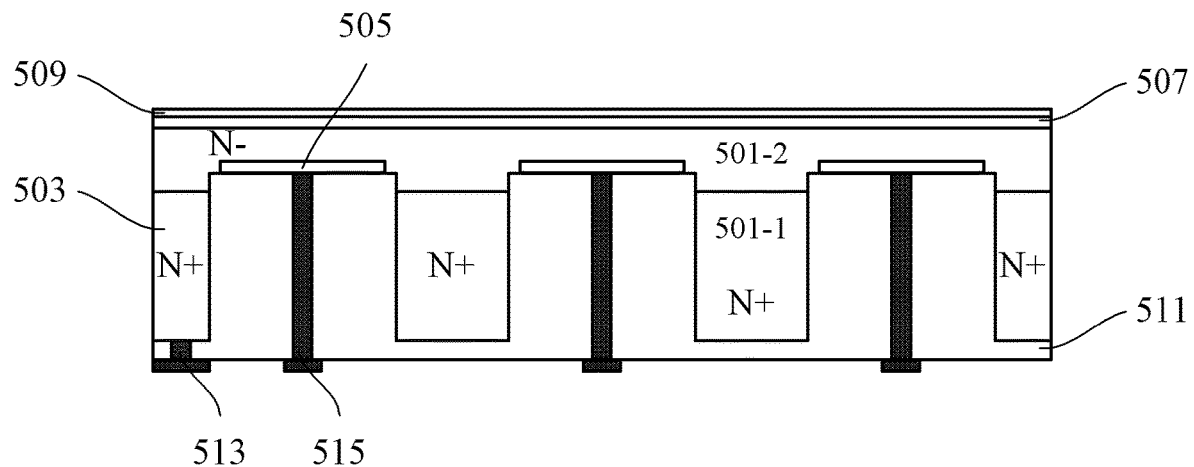
Figure 6J:
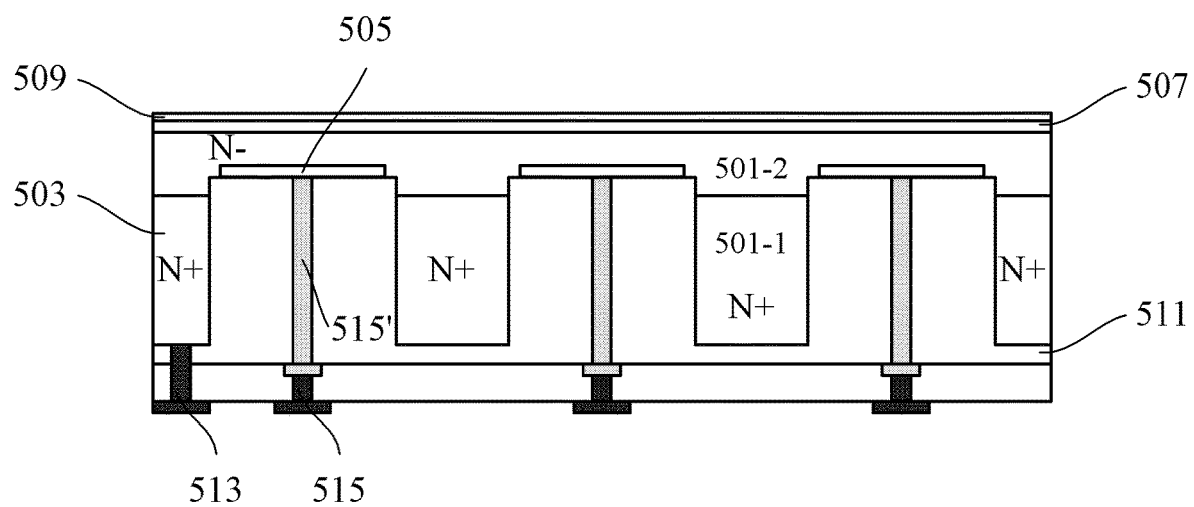
FIG. 6J depicts a cross-sectional view of a contact in accordance with another embodiment of the present disclosure.

Contacts 513, 515 to the first electrode region 503 and the second electrode regions 505 may be fabricated so as to lead them out, as illustrated in FIG. 6I. Alternatively, as shown in FIG. 6J, contacts such as stack structures of doped semiconductor 515' and metal 515 may be formed. Regarding this, reference may be made to the above description.

In the above embodiment, the stack structures are formed only for the contacts to the second electrode regions. However, the present disclosure is not limited thereto. For example, a stack structure may also be similarly formed for the contact to the first electrode region.

In the above description, detailed descriptions of the technical details such as patterning and etching of the respective layers have not been made. However, it will be understood by those skilled in the art that layers, regions, and the like of a desired shape can be formed in various ways. In addition, to form the same structure, those skilled in the art can also design one or more methods that are not exactly the same as the method described above. In addition, although the respective embodiments have been separately described above, this does not necessarily mean that the measures in the respective embodiments cannot be used in combination to advantage.

The embodiments of the present disclosure have been described above. However, those embodiments are for illustrative purposes only and are not intended to limit the scope of the disclosure. The scope of the disclosure is defined by the appended claims and their equivalents. Numerous alternatives and modifications may be made therein by those skilled in the art without departing from the scope of the present disclosure.

We claim:
1. A photodiode device, comprising: a substrate being first type heavily doped and comprising a first surface and a second surface opposite to each other, wherein the first type heavily doped substrate serves as a first electrode region of the photodiode device, and wherein the substrate defines a trench having an opening on the first surface and extending into the substrate toward the second surface;
   an epitaxial layer grown on the second surface of the substrate, wherein the epitaxial layer is first type lightly doped, and is exposed by the trench;
   a second electrode region formed within the trench and being second type heavily doped, wherein the epitaxial layer and the second electrode region form a PN junction of the photodiode device, and the second electrode region is electrically isolated from the first electrode region;
   a passivation layer formed on the first surface of the substrate and covering the first electrode region and the second electrode region, the passivation layer filling the trench and defining a surface having a portion over the trench disposed away from the first surface of the substrate; wherein the surface extends over both the trench and regions of the first surface of the substrate outside the trench and is substantially planer; wherein the passivation layer consists of a single layer of like material throughout the single layer; and
   first and second electrical contacts penetrating through the passivation layer to extend to the respective first type heavily doped substrate and the second electrode region, respectively, wherein the second electrical contact is metallic and extends to the second electrode region from the passivation layer surface portion over the trench along a direction substantially perpendicular to the first surface of the substrate.

2. The photodiode device of claim 1, wherein the first electrode region is formed to surround the second electrode region.

3. The photodiode device of claim 1, wherein the trench has a depth greater than a thickness of the substrate such that the trench extends into the epitaxial layer.

4. The photodiode device of claim 1, 2, or 3 further comprising:
   a first type heavily doped layer formed on a surface of the epitaxial layer facing away from the first surface of the substrate; and
   an insulating layer formed on the first type heavily doped layer.

5. A photodiode detector, comprising:
   an array comprising a plurality of photodiode devices of claim 4.

6. A photodiode detector, comprising:
An array comprising a plurality of photodiode devices of claim 1, 2, or 3.

7. The photodiode detector of claim 6, wherein the first electrode regions of the respective photodiode devices are connected to each other, and the second electrode regions of the respective photodiode devices are separated from each other.

8. The photodiode device of claim 1, wherein the trench has a tapered cross section having a decreasing width from the first surface toward the second surface.

9. The photodiode device of claim 8, wherein the passivation layer consists of a single layer of like material throughout the layer.

10. The photodiode device of claim 1, wherein the passivation layer has a substantially uniform thickness within the trench.

11. The photodiode device of claim 1, wherein the passivation layer has a tapered cross section having a decreasing width from the first surface toward the second surface.

* * * * *